United States Patent [19]

Kuroda et al.

[11] Patent Number: 4,766,092

[45] Date of Patent: Aug. 23, 1988

[54] METHOD OF GROWING HETEROEPITAXIAL INP ON SI USING SN SUBSTRATE IMPLANTATION

[75] Inventors: Takao Kuroda; Kenji Hiruma, both of Koganei; Hiroyoshi Matsumura, Saitama, all of Japan

[73] Assignee: Hitachi, Ltd., Tokyo, Japan

[21] Appl. No.: 937,019

[22] Filed: Dec. 2, 1986

[30] Foreign Application Priority Data

Dec. 2, 1985 [JP] Japan .................. 60-269396

[51] Int. Cl.[4] .................. H01L 21/20; H01L 7/38; H01L 7/54
[52] U.S. Cl. .................. 437/126; 437/107; 437/110; 437/133; 437/976; 156/610; 156/613; 148/DIG. 72; 148/DIG. 97; 148/DIG. 119; 357/16; 357/60; 357/91
[58] Field of Search .................. 29/571, 576 E, 576 B, 29/580; 148/1.5, 175, 187, 33.4, 189, DIG. 48; 156/610, 612–614; 357/91, 63, 58, 23.2, 23.15; 427/87, 85; 437/126, 107, 110, 133, 976

[56] References Cited

U.S. PATENT DOCUMENTS

| 3,520,741 | 7/1970 | Mankarious | 148/175 |
| 3,793,093 | 2/1974 | Nishizawa et al. | 148/187 |
| 3,836,999 | 9/1974 | Nishizawa | 357/63 |
| 4,133,702 | 1/1979 | Krimmel | 148/1.5 |
| 4,177,321 | 12/1979 | Nishizawa | 427/87 |
| 4,622,093 | 11/1986 | Tsang | 156/610 |

OTHER PUBLICATIONS

Gonda et al., "Heteroepitaxial Growth of GaP on Silicon by Molecular Beam Epitaxy", Jpn. J. Appl. Phys., 22(6), Jun. 1978, pp. 1043–1048.
Metze et al., ". . . GaAs Layers Grown Directly on Si Substrates by Molecular Beam Epitaxy", Appl. Phys. Lett., 45(10), Nov. 15, 1984, pp. 1107–1109.
Fischer et al., ". . . GaAs/AlGaAs Modulation-Doped Field-Effect Transistors and . . . Silicon circuits", Appl. Phys. Lett., 47(9), Nov. 1, 1985, pp. 983–985.
Wang, "Molecular Beam Epitaxial Growth and Material Properties of GaAs and AlGaAs on Si(100)", Appl. Phys. Lett., 44(12), Jun. 15, 1984, pp. 1149–1151.
Esaki et al., "Incorporation of Dopant Species in Molecular Beam Epitaxial Materials . . . ", IBM TDB, vol. 17, No. 10, Mar. 1975, pp. 3108–3109.
Ota, "Silicon Molecular Beam Epitaxy with Simultaneous Ion Implant Doping", J. Appl. Phys., 51(2), Feb. 1980, pp. 1102–1110.

Primary Examiner—Brian E. Hearn
Assistant Examiner—William Bunch
Attorney, Agent, or Firm—Antonelli, Terry & Wands

[57] ABSTRACT

When a semiconductor device is produced by growing epitaxially a compound semiconductor layer on a Si or Ge substrate, lattice matching between the substrate crystal and the compound semiconductor layer to be formed on the substrate can be improved by ion-implanting an ion species element, which increases the lattice constant of Si or Ge as the substrate, into the Si or Ge substrate in order to increase its lattice constant. In comparison with conventional semiconductor devices using Si or Ge into which ion implantation is not made, the semiconductor device produced by the method described above can improve remarkably its characteristics. In the case of a semiconductor laser device, for example, its threshold value drops drastically and its service life can be prolonged remarkably.

15 Claims, 1 Drawing Sheet

METHOD OF GROWING HETEROEPITAXIAL INP ON SI USING SN SUBSTRATE IMPLANTATION

BACKGROUND OF THE INVENTION

This invention relates to a method of producing a semiconductor device by growing epitaxially a compound semiconductor layer on an element semiconductor substrate crystal, and more particularly to a method of producing a semiconductor device by forming a compound semiconductor layer on a single element substrate such as Si or Ge.

Recently, semiconductor lasers and HEMTs (High Electron Mobility Transistors) have been fabricated by forming a compound semiconductor layer on a Si or Ge substrate by low temperature growth using MOCVD (Organometallic Chemical Vapor Deposition) or MBE (Molecular Beam Epitaxy).

The reasons why Si is used recently for the substrate are as follows:

(i) Si is economical.

(ii) An extremely large dislocation-free substrate can be produced in comparison with a GaAs substrate and an InP substrate.

(iii) A hybrid OEIC (Optoelectronic Integrated Circuit) can be obtained by forming in advance a device on the Si substrate and then a GaAs device, for example, on the former.

(iv) In the item (iii) described above, a device capable of optical communication between wafers can be obtained by forming a laser or a light emission diode and a photo-detective element by GaAs or InP, for example.

The reasons why Ge is used for the substrate are the same as Si. In addition, since Ge has extremely good lattice matching with GaAs at room temperature, it is suitable for GaAs system devices. Furthermore, InP/Ge, too, has better lattice matching than InP/Si because the lattice mismatching of the former is ½ of the latter. Therefore, Ge is suitable for forming InP system devices, too. However, the resulting Ge wafer is smaller than the Si wafer.

When a GaAs layer is grown epitaxially on a Ge substrate or a Si substrate on which Ge is grown epitaxially, autodoping of Ge into the epitaxial growth layer becomes problems. If the GaAs layer is grown directly on the Si substrate, crosshatchlike misfit dislocations are likely to occur. In addition, a kind of twin structure called "Anti-phase Domain" is likely to occur because the binding force is greater between Ge or Si and As or P than between Ge or Si and Ga or Al, or the like, and because of ruggedness and steps on the surface.

No prior art reference relating to, or analogous to, the present invention can be found to the best knowledge of the present inventors.

SUMMARY OF THE INVENTION

The object of the present invention is to solve the problems of the prior art described above and to provide a method of producing a semiconductor device using a single element semiconductor substrate crystal made of Si, Ge or the like, on which a III-V or II-VI group compound semiconductor layer having less defect can be formed.

The method of producing a semiconductor device in accordance with the present invention implants in advance and at high energy and in a substantially uniform concentration the ions of an element that can suitably increase the lattice constant of a semiconductor substrate crystal made of Si or Ge into the region of the substrate crystal which is from 0.5 to 5 μm deep from the surface, in order to improve the lattice matching between the substrate crystal and a III-V or II-VI group compound semiconductor to be grown epitaxially on the substrate. The reason why the ion implantation depth is from 0.5 to 5 μm is as follows. If it is below 0.5 μm, the effect of ion implantation is not sufficient and if it is above 5 μm, the ion implantation becomes too great practically. The ion implantation depth that can be attained very easily at present is about 2 μm, but ion implantation can be made to a depth greater than 2 μm.

In order to easily grow epitaxially a crystal layer with less defect, it has been preferable to keep the difference of lattice constant between the substrate crystal and the crystal layer below 3% at a crystal growing temperature. Needless to say, the smaller the difference of lattice constant, the better, and ideally, the difference of lattice constant is zero. Incidentally, the difference of lattice constant is above 3% between the conventional Si substrate and the GaAs growth layer and reaches about 6% between the Si substrate and an InP growth layer. Thus, there is great lattice mismatching between the substrate and the growth layer. In accordance with the present invention, the latttice constant near the surface of the Si or Ge substrate is increased by ion implantation and is brought close to that of the compound semiconductor layer to be grown on the substrate.

As described above, the concentration of the implanted ions is made substantially uniform in the region which is from 0.5 to 5 μm deep from the substrate surface. In order to make the ion concentration uniform depthwise, ion implantation is carried out while changing the ion implantation energy so as to change the depth at which the concentration of the implanted ion becomes maximal. If the ions are implanted at a predetermined constant energy and in a predetermined constant dose, an ion concentration distribution is obtained in which the ion concentration attains a peak value at a depth corresponding to the implantation energy and which is approximate to Gauss distribution. Therefore, while the dose is kept constant, the ion implantation energy is changed. In other words, if the ion implantation is carried out while moving the peak position of the ion concentration, the ion concentration in the depth direction can be made substantially uniform. Though the distribution of ion concentration within a plane is made uniform, too, it can be accomplished by a known ion implantation method.

The lattice constant of the substrate crystal is increased by ion implantation and is made approximate to that of the epitaxial growth layer to be formed on the substrate crystal. Therefore, even if the dose is small, some effect can be obtained. However, a preferred atomic concentration of the ion to be implanted is such that the difference of lattice constant is up to 3% between the substrate crystal and the epitaxial growth layer to be formed on the substrate crystal, and more preferably, the lattice constant is up to 1%. The dose of ion implantation may be increased within the capacity of implantation apparatus so high as the difference of lattice constant becomes close to zero, but if the dose is increased, the ion implantation time becomes long. Therefore, the dose is limited in practice from the aspect of the ion implantation time.

Preferably, the relation between the lattice constant of the substrate surface and the concentration of the atoms that are ion-implanted is determined in advance by calculation or by experiments for the necessary combination of the substrate material and the ion species element to be implanted. According to the result of the preparatory experiments described above, the atomic concentration of ion implantation to obtain a substrate having a lattice constant different by a predetermined value from the lattice constant of the growth layer to be formed on the substrate can be determined. The dose of ion implantation can be determined from this atomic concentration.

In ion implantation, the concentration $n(x)$ (cm$^{-3}$) of the implanted atoms at the position spaced about by X (cm) in the direction of depth from the substrate surface can be expressed as follows:

$$n(x) = n(R_p) \exp\left[ -\frac{(x - R_p)^2}{2\Delta R_p^2} \right] \quad (1)$$

In eq. (1) above, $R_P$ is a peak depth (cm) of the concentration distribution and $\Delta R_P$ is standard deviation (cm) of the concentration distribution. Both of them are determined by the combination of the ion species element and the substrate material and the ion implantation energy. As these $R_P$ and $\Delta R_P$ values, it is possible to use, for example, the result of calculation described in D. K. Brice "Ion Implantation Range and Energy Deposition Distribution, Vol 1", published by IFL/Plenum, N.Y., (1975).

The maximum atomic concentration $n(R_P)$ at the peak depth $(X=R_P)$ of the concentration distribution has the following relation with the dose $\phi$(cm$^{-2}$):

$$n(R_p) = \frac{\phi}{\sqrt{2\pi} \cdot \Delta R_p} \quad (2)$$

From eq. (2), the dose $\phi$(cm$^{-2}$) is given as follows:

$$\phi \approx 2.506 \cdot \Delta R_p \cdot n(R_p) \quad (3)$$

In this manner, the dose of ion implantation can be determined.

Practically, it is possible to determine the dose which attains a desired lattice constant by changing the dose and examining the lattice constant of the substrate at each dose.

If pitch grooves having a pitch of up to 3,000 Å, a width of 100 to 1,000 Å and a depth of 100 to 1,000 Å are formed on the substrate crystal surface, the crystal growth starts preferentially from the bottom of the grooves and then expands to the whole portion. Accordingly, the occurrence of the anti-phase domain can be prevented.

DESCRIPTION OF THE PREFERRED EMBODIMENTS

EMBODIMENT 1

After a (100) plane Si wafer having a diameter of 200 mm is rinsed by an organic agent, it is divided into two groups. As soon as the groups are etched by a known HF:HNO$_3$ type etching solution, one of the groups is subjected to epitaxial growing treatment by MOCVD or MBE in order to epitaxially grow a GaAlAs system semiconductor laser structure (Referential Example). On the other hand, after the other of the two groups is etched in the same way as described above, Ge ions are injected into the entire surface of the Si substrate in a concentration of $1 \times 10^{19} \sim 1 \times 10^{21}$ cm$^{-3}$ to a depth of 3 μm from the surface by a high energy ion implantation apparatus, and then a GaAlAs system semiconductor laser is produced (This Invention) in the same way as the Referential Example. The surface conditions and device characteristics of these lasers are examined.

To inject the Ge ions into the Si substrate to the depth of 3 μm, the necessary ion acceleration energy is about 8 MeV for Ge$^+$ and about 4 MeV for Ge$^{++}$. This acceleration energy is gradually increased until the depth at the maximum concentration of the injected atoms reaches the value at the depth of 3 μm from the value at the surface. The dose corresponding to the Ge concentration of $1 \times 10^{19} \sim 1 \times 10^{21}$ cm$^{-3}$ described above is $7.8 \times 10^{14} \sim 7.8 \times 10^{16}$ cm$^{-2}$.

Figure 1:
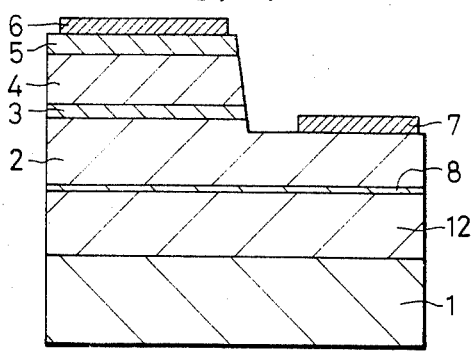
FIG. 1 is a sectional view of a semiconductor device produced in accordance with one embodiment of the present invention.

The semiconductor laser structure is formed in the following manner. FIG. 1 is a sectional view of the semiconductor laser device produced in this embodiment.

First of all, the production method by MOCVD will be described. After the Ge ion implantation region 12 is formed on the surface of the n-type Si substrate 1 as described above, the GaAlAs system semiconductor laser structure is grown on the ion implantation region 12 by MOCVD, and a part thereof is removed by etching till a clad layer 2 made of n-type Al$_{0.3}$GA$_{0.7}$As. An n-type ohmic electrode 7 is then formed on the exposed clad layer 2 by evaporating alloy obtained by sequentially evaporating AuGe, Ni and Au. When growing the crystal layer by MOCVD, the substrate temperature is kept at 500° C. and an about 500 Å-thick n-type AlGaAs layer 8 is grown on the surface of the Ge ion implantation region 12 of the Si substrate 1. Then, the substrate temperature is raised to 750° C. and the laser structure shown in FIG. 1 is grown.

The crystal growing condition by MOCVD is as follows. The total flow rate of hydrogen is 5 l/min, an As source is AsH$_3$ (arsine mixed in a concentration of 10 vol % in H$_2$), its flow rate is 150 sccm, a Ga source is TMG (trimethylgallium), its flow rate is 3 sccm, an Al source is TMA (trimethylaluminum), its flow rate is 2 sccm, a p-type impurity source is DEZn (diethylzinc mixed in a concentration of 1 vol % in H$_2$), its flow rate is 5 sccm, an n-type impurity source is H$_2$Se contained in 10 ppm concentration in H$_2$ and its flow rate is 5 sccm.

In MBE, the single element of each of Ga, Al, As, p-type Be and n-type Si is used as the starting source. First of all, the substrate temperature is raised to 800° C. to remove any oxides and then the substrate temperature is lowered to 450° C. An n-type AlGaAs layer 8 is then deposited in a thickness of 500 Å. After the substrate temperature is raised to 690° C., the laser structure shown in FIG. 1 is grown. The As temperature is 300° C. and the ratio As/(Ga+Al) is about 3 in order to grow the AlGaAs layer. The method of forming the electrode 7 is the same as in MOCVD.

In FIG. 1, reference numeral 1 represents an n-type Si substrate having an n-type impurity concentration of about $1\times10^{17}$ cm$^{-3}$; 2 denotes a clad layer of an n-type Al$_{0.3}$Ga$_{0.7}$As which has an n-type impurity concentration of $1\times10^{18}$ cm$^{-3}$ and is 2 μm thick; 3 denotes a 0.1 μm thick undoped GaAs active layer; 4 denotes a clad layer of p-type Al$_{0.3}$Ga$_{0.7}$As which has a p-type impurity concentration of about $1\times10^{18}$ cm$^{-3}$ and is about 2 μm thick; 5 denotes a cap layer made of p-type GaAs which has a p-type impurity concentration of about $1\times10^{18}$ cm$^{-3}$ and is 1 μm thick; 6 denotes a p-type ohmic electrode consisting of an Au layer and a Zn layer; 7 denotes an n-type ohmic electrode consisting of an Au-Ge alloy layer, an Ni layer and an Au layer; 8 denotes 500 Å thick n-type AlGaAs layer; and 12 denotes a Ge ion implantation region.

Figure 2:
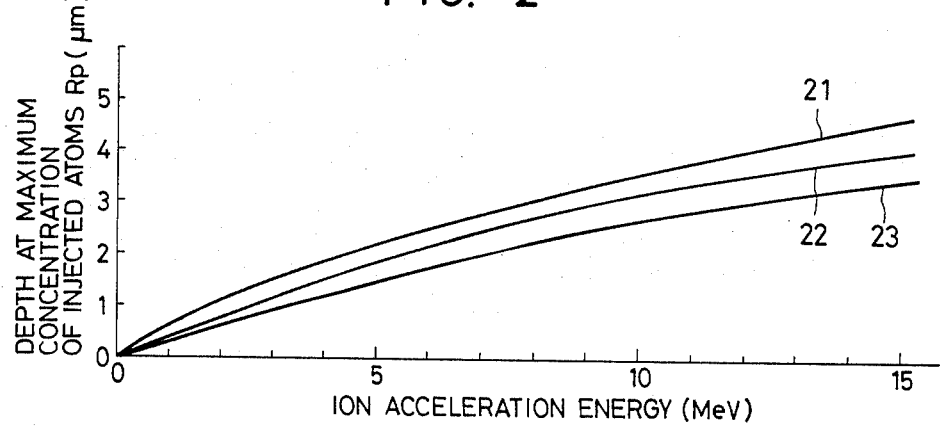
FIG. 2 is a diagram showing the relation between ion acceleration energy and a depth at a maximum concentration of injected atoms.

FIG. 2 is a diagram showing the reaction between the ion acceleration energy (MeV) and the depth at the maximum concentration of the injected atoms in ion implantation. Curve 21 represents the implantation of Ge$^+$ ion into the Si substrate (Embodiment 1), curve 22 represents the implantation of Sn$^+$ ion into the Si substrate (Embodiments 2 and 3) and curve 23 represents the implantation of Sn$^+$ ion into the Ge substrate (Embodiment 4). The ion implantation energy can be determined from FIG. 2. When the combination of the ion species element and the substrate crystal is different from the combinations described above, too, the ion acceleration energy at the time of ion implantation can be determined from such data.

A semiconductor device of Referential Example is produced in exactly the same way as the semiconductor device of this Embodiment except that the ion implantation process of Ge ion into the Si substrate is omitted. Hereinafter, the surface condition and device characteristics of the semiconductor device of this Embodiment will be described in comparison with those of the Referential Example.

The crosshatch pattern due to misfit dislocation can be seen occurring partially in the crystal which is directly grown, on the Si substrate as the semiconductor laser structure, the threshold value of the laser is as high as 4 kA/cm$^2$ and the life of the device is often below 1,000 hours. On the other hand, in the crystal where Ge ion is implanted into the Si substrate and then the laser structure is grown epitaxially, misfit dislocation does not generate, the threshold value of the laser is 2 kA/cm$^2$ and the life is about 100,000 hours. Thus, the performance and life equal to those of the laser devices obtained by the epitaxial growth on the ordinary GaAs compound semiconductor single crystal substrate is obtained. This difference is assumed to result from the fact that since the lattice constant of the ion implantation layer becomes greater than the original lattice constant of Si, lattice matching with the GaAlAs growth layer is improved and hence, the internal stress is reduced. In addition, the higher the Ge concentration on the surface of the Si substrate, the higher becomes the mirror luster property of the surface.

The lattice constant of Si before Ge ion implantation is 5.43 Å and the mean lattice constant of the Si substrate surface after Ge ion implantation is 5.50~5.55 Å. The lattice constant of the AlGaAs layer is 5.65 Å.

EMBODIMENT 2

After surface treatment is made on a (100) plane Si wafer having a diameter of 200 mm in the same way as in Embodiment 1, Sn is ion-implanted in a depth of 2 μm in a concentration of $1\times10^{19}\sim1\times10^{20}$ cm$^{-3}$ by high energy ion implantation. Thereafter, a GaAlAs system semiconductor laser is epitaxially grown by MOCVD or MBE. On the other hand, the laser described above is directly grown on the Si substrate without ion implantation of Sn ion. The surface condition and device characteristics of these two kinds of devices are compared.

To implant Sn ion into the Si substrate in a depth of 2 μm, ion acceleration energy of about 5.4 MeV is necessary for Sn$^+$ and about 2.7 MeV for Sn$^{++}$. Incidentally, the acceleration energy is gradually increased from the value at which the depth at the maximum concentration of the injected atoms is at the substrate surface till it is at the depth of 2 μm. The dose corresponding to the Sn$^+$ concentration of $1\times10^{19}\sim1\times10^{20}$ cm$^{-3}$ is $7.5\times10^{14}\sim7.5\times10^{15}$ cm$^{-2}$.

The semiconductor laser structure and its formation method are the same as those of Embodiment 1. Hereinafter, the characteristics of the semiconductor device obtained in this Embodiment will be compared with those of the Referential Example.

In the case of the Sn ion implantation, very small precipitates occur in the implantation layer exceeding the concentration of $5\times10^{19}$ cm$^{-3}$, but they do not affect the surface morphology of the GaAlAs layer formed thereon and a mirror surface can be obtained. The characteristics and life of the laser are substantially equal to those of the laser grown on the GaAs substrate.

The Referential Example using the Si substrate without Sn ion implantation is already described in Embodiment 1.

EMBODIMENT 3

Generally, the mean lattice constant $\bar{a}$, when x is the Sn molar ratio in Si on the portion very close to the surface (within about 0.2 μm) of the Si substrate crystal, can be expressed as follows:

$$\bar{a}=x\cdot(Sn\ lattice\ constant\ 6.46\ \text{Å})+(1-x)\cdot$$

(Si lattice constant 5.43 Å)
The mean lattice constant $\bar{a}$ of the substrate surface becomes 5.90 Å when x is a high concentration of 45 at. %, and is substantially in agreement with the lattice constant of InP.

A Si substrate is produced in the same way as in Embodiment 2 except that the Sn concentration near the surface of the Si substrate is 45 at %. An InGaAsP system semiconductor laser structure having lattice matching with InP is formed on this Si substrate by MOCVD. On the other hand, the same InGaAsP system semiconductor laser structure is formed on an Si substrate into which the Sn ion is not implanted, as Referential Example.

Figure 3:
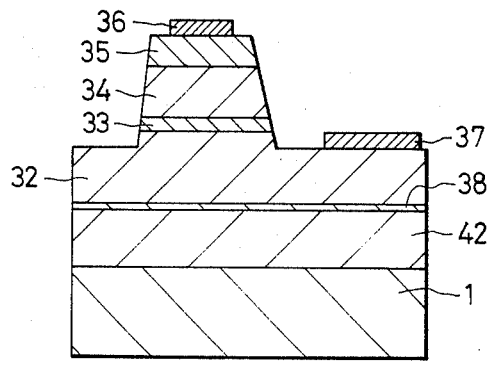
FIG. 3 is a sectional view of a semiconductor device produced in accordance with another embodiment of the present invention.

The semiconductor laser structure is produced in the following manner. FIG. 3 is a sectional view of the semiconductor laser device formed in this Embodiment.

After an Sn ion implantation region 42 is formed on the surface of an n-type Si substrate 1 containing about $1\times10^{17}$ cm$^{-3}$ n-type impurity in the manner described above, an about 500 Å thick InP layer 38 is grown on the ion implantation region 42 at a substrate temperature of 500° C. After the substrate temperature is raised to 680° C., a 2.5 μm thick n-type InP clad layer 32, a 0.2 μm thick undoped InGaAsP active layer 33, a 2.5 μm thick p-type InP clad layer 34 and a 1 μm thick p-type InGaAsP cap layer 35 are grown sequentially. The n-type impurity concentration of the n-type InP clad layer 32 is about $1 \times 10^{18}$ cm$^{-3}$, and the p-type impurity concentration of the p-type InP clad layer 34 is about $1 \times 10^{18}$ cm$^{-3}$.

As to the primary sources in the crystal growth by MOCVD, the In source is TEI (triethyl indium), the Ga source is TEGa (triethyl gallium), the As source is arsine AsH$_3$ and the P source is phosphine PH$_3$. Each of these materials is mixed in a H$_2$ stream. The p-type impurity source is DEZn (diethylzinc) and the n-type impurity source is H$_2$Se.

After each layer described above is formed, the substrate with the grown layers is etched in a mesa-like form till the n-type InP clad layer 32 appears, and AuGe, Ni and Au layers are sequentially deposited on this clad layer 32 to form an n-type ohmic electrode 37. A p-type ohmic electrode 36 consisting of an Au layer and a Cr layer is formed at the top of the masa.

On the other hand, a semiconductor device of Referential Example is formed in the same way as the method of producing the semiconductor device of this Embodiment except that Sn ion is not implanted into the Si substrate. Hereinafter, the surface condition and characteristics of the semiconductor device obtained in this Embodiment will be compared with those of the Referential Example.

It is found that when the Sn ion is implanted, the surface of each growth layer becomes a mirror surface and the generation of misfit dislocation can be prevented. The mesa stripe laser, which is 300 μm long and has an active layer width of 3 μm, has a low threshold value of 50 mA. On the other hand, in the semiconductor laser of the Referential Example wherein the semiconductor laser structure is directly grown on the Si substrate without ion-implanting the Sn ion, dislocations of an extremely high density generate in the grown layers, threshold value is as high as 200 mA and only pulse oscillation occurs.

When the semiconductor laser structure is formed by MBE, substantially the same result can be obtained as in the case of MOCVD.

EMBODIMENT 4

An InGaAsP system semiconductor laser is grown epitaxially on a Ge single crystal (100) wafer into which Sn is ion-implanted, and good characteristics can be obtained as in the Embodiment described above. When implanting the Sn ion into the Ge substrate, the ion acceleration energy is determined with reference to FIG. 2, for example.

Embodiments Nos. 2, 3 and 4 described above use Sn as the ion species element. However, since Sn, In and Sb have mutually approximate atomic weight, they can be implanted into the substrate under substantially the same ion implantation condition. Good results can be obtained as in the foregoing Embodiments when In or Sb is ion-implanted into the Si or Ge substrate surface.

The method described above can be applied to II–VI group compound semiconductors such as ZnS (lattice constant 5.420), CdS (lattice constant 5.832), and the like.

As can be understood from the description given above, since the method of the present invention uses ion implantation, it provides excellent uniformity in the wafer plane. The present method is more advantageous in producibility and economy than the conventional methods using the GaAs substrate, the InP substrate, or the like, particularly because the present method can integrate a large number of devices on the same wafer. The threshold value of the laser produced in accordance with the method of the present invention drops by far drastically than the laser device formed on the Si or Ge substrate without ion implantation, the service life of the laser can be extended remarkably.

What is claimed is:

1. A method of producing a semiconductor device comprising the steps of:
   ion-implanting an ion species of Sn, into a substrate of Si crystal; and
   growing epitaxially a layer of compound semiconductor material of single crystal InP on the ion-implanted surface of said substrate.

2. The method of producing a semiconductor device as defined in claim 1, wherein said ion species element is ion-implanted from the surface of said substrate crystal in a depth of 0.5 to 5 μm.

3. The method of producing a semiconductor device as defined in claim 1, wherein the compound semiconductor layer is epitaxially grown by MOCVD.

4. The method of producing a semiconductor device as defined in claim 1, wherein the compound semiconductor layer is epitaxially grown by MBE.

5. The method of producing a semiconductor device as defined in claim 1, wherein the ion-implanting is performed so as to change the lattice constant of the substrate of Si crystal to be less than 3% different than the lattice constant of said layer of compound semiconductor material.

6. The method of producing a semiconductor device as defined in claim 5, wherein said ion species element is ion-implanted from the surface of said substrate crystal in a depth of 0.5 to 5 μm.

7. The method of producing a semiconductor device as defined in claim 6, wherein the impurity concentration of the ion-implanted impurity is made substantially uniform in the depth direction.

8. The method of producing a semiconductor device as defined in claim 6, wherein the ion-implanting is performed so as to change the lattice constant of the substrate of Si crystal to be less than 1% different than the lattice constant of said layer of compound semiconductor material.

9. A method of producing a semiconductor device comprising the steps of:
   ion-implanting an ion species of Sn into a substrate of Si crystal; and
   growing epitaxially a layer of compound semiconductor material selected from the group consisting of single crystal InP and InP system mixed crystal on the ion-implanted surface of said substrate.

10. The method of producing a semiconductor device as defined in claim 9, wherein said layer of compound semiconductor material is InP system mixed crystal.

11. The method of producing a semiconductor device as defined in claim 10, wherein the compound semiconductor layer is epitaxially grown by MOCVD.

12. The method of producing a semiconductor device as defined in claim 10, wherein the compound semiconductor layer is epitaxially grown by MBE.

13. The method of producing a semiconductor device as defined in claim 10, wherein the ion-implanting is performed so as to change the lattice constant of the substrate of Si crystal to be less than 3% different than the lattice constant of said layer of compound semiconductor material.

14. The method of producing a semiconductor device as defined in claim 13, wherein said ion species element is ion-implanted from the surface of said substrate crystal in a depth of 0.5 to 5 μm.

15. The method of producing a semiconductor device as defined in claim 14, wherein the impurity concentration of the ion-implanted impurity is made substantially uniform in the depth direction.

* * * * *